(12) United States Patent
Yasuda et al.

(10) Patent No.: US 10,959,324 B2
(45) Date of Patent: Mar. 23, 2021

(54) BUSBAR MODULE

(71) Applicant: Yazaki Corporation, Tokyo (JP)

(72) Inventors: Tomoji Yasuda, Makinohara (JP);
Yoshiaki Ichikawa, Makinohara (JP);
Tatsuya Oga, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 15/930,736

(22) Filed: May 13, 2020

(65) Prior Publication Data

US 2020/0396830 A1    Dec. 17, 2020

(30) Foreign Application Priority Data

Jun. 17, 2019  (JP) .............................. JP2019-112232

(51) Int. Cl.
*H05K 1/02* (2006.01)
*H01M 2/20* (2006.01)
*B60R 16/033* (2006.01)

(52) U.S. Cl.
CPC .......... *H05K 1/0277* (2013.01); *H01M 2/206* (2013.01); *B60R 16/033* (2013.01); *H01M 2220/20* (2013.01); *H05K 2201/10189* (2013.01); *H05K 2201/10272* (2013.01)

(58) Field of Classification Search
CPC ....... H05K 2201/10272; H05K 1/0277; H05K 2201/10189; H05K 2201/10172; H05K 2201/052; H05K 1/189
USPC ....................................................... 174/254
See application file for complete search history.

(56) References Cited

U.S. PATENT DOCUMENTS

| 2012/0231638 A1 | 9/2012 | Ikeda et al. |
| 2015/0069829 A1 | 3/2015 | Dulle et al. |
| 2018/0090735 A1 | 3/2018 | Huff et al. |
| 2018/0219204 A1* | 8/2018 | Takase .................. H01M 2/348 |
| 2019/0027731 A1* | 1/2019 | Zeng ................... H01M 2/1077 |
| 2019/0081311 A1* | 3/2019 | Zeng .................... H01R 12/774 |
| 2019/0088912 A1 | 3/2019 | Goh et al. |
| 2019/0181418 A1 | 6/2019 | Son et al. |

FOREIGN PATENT DOCUMENTS

| CN | 106299223 A | 1/2017 |
| JP | 2014-220128 A | 11/2014 |

* cited by examiner

*Primary Examiner* — Sherman Ng
(74) *Attorney, Agent, or Firm* — Banner & Witcoff, Ltd.

(57) ABSTRACT

A busbar module includes: a circuit body having a flexible circuit board; busbars; and a holder. The circuit body has: a band-shaped main strip to be located to extend in a stacking direction of cells; a band-shaped first branch strip branched from the main strip and extending toward a corresponding busbar; and a second branch strip branched from the main strip and extending toward an external device. The first branch strip has: a bent portion extending in the stacking direction and having a bent shape around an axis crossing the stacking direction; and a busbar connection portion disposed closer to an end of the first branch strip than the bent portion and connected to the corresponding busbar. The second branch strip has a device connection portion to be connected to the external device.

6 Claims, 11 Drawing Sheets

BUSBAR MODULE

CROSS-REFERENCES TO RELATED APPLICATION(S)

This application is based on and claims priority from Japanese Patent Application No. 2019-112232 filed on Jun. 17, 2019, and the entire contents of which are incorporated herein by reference.

BACKGROUND

Field of the Invention

The present invention relates to a busbar module.

Description of Related Art

Conventionally, busbar modules are used in such a manner as to be attached to a battery assembly (i.e., a battery module in which plural battery cells are laid on each other) that is a drive power source installed in an electric vehicle, a hybrid vehicle, or the like.

The busbar module disclosed in Patent document 1 is equipped with plural busbars each of which connects a positive electrode and a negative electrode of adjacent ones of battery cells laid on each other and voltage detection lines that are connected to the respective busbars and serve to monitor the individual battery cells. The voltage detection lines are a bundle of plural electric wires each having a common structure that a core wire is covered with an insulating covering.

As for details of the above connector, refer to JP 2014-220128 A.

SUMMARY

Incidentally, in general, battery cells constituting a battery assembly extend and contract in the stacking direction due to heat generated in association with charging and discharging, an environment temperature, etc. As a result, the battery assembly (battery module) is also deformed, that is, extends and contracts, in the battery cells stacking direction. Furthermore, in general, the size of a battery assembly in the stacking direction may vary from one battery assembly manufactured to another (manufacture dispersion) due to an assembling allowance of stacking of plural battery cells. To accommodate such deformation of the battery assembly and manufacture dispersion, in general, busbar modules are designed in such a manner that the lengths of the voltage detection lines have certain margins.

However, in the above conventional busbar module, in the case where the number of battery cells laid on each other is increased to, for example, increase the capacity of the battery assembly, the number of electric wires constituting the voltage detection lines is also increased. As a result, when the voltage detection lines are formed by bundling such a large number of electric wires, the stiffness of all the voltage detection lines (and hence the stiffness of the busbar module) is increased, which makes it difficult to increase the efficiency of work of attaching the busbar module to the battery assembly (the ease of attachment). For the same reason, it may become difficult for the busbar module to extend and contract to absorb deformation and manufacture dispersion of the battery assembly sufficiently.

On the other hand, the location of an external device (e.g., voltage detection device) to which the electric wires of the voltage detection lines are connected and the structure of the external device itself may vary depending on, for example, the specifications of a battery assembly that employs the busbar module and a vehicle in which the battery assembly is installed. It is desirable that the busbar module be configured so as to be able to flexibly accommodate such various installation locations and structures of external devices, in other words, to increase the degree of freedom of selection of an installation location and a structure of an external device.

An object of the invention is to provide a busbar module that is high in the ease of attachment to a battery assembly and the followability to deformation and manufacture dispersion of the battery assembly and is also high in the degree of freedom of selection of an installation location and a structure of an external device.

Embodiments of the present invention provide the following items [1] to [5]:

[1] A busbar module to be attached to a battery assembly having a stack of a plurality of cells and to connect the plurality of the cells to an external device, the busbar module comprising:
  a circuit body having a flexible circuit board including a wiring pattern; a plurality of busbars to be connected to corresponding electrodes of the plurality of the cells; and a holder holding the busbars and being extendable in a stacking direction of the plurality of the cells,
  the circuit body having:
  a band-shaped main strip to be located to extend in the stacking direction;
  a band-shaped first branch strip branched from the main strip and extending toward a corresponding busbar among the plurality of the busbars; and
  a second branch strip branched from the main strip and extending toward the external device,
  the first branch strip having:
  a bent portion extending in the stacking direction and having a bent shape around an axis crossing the stacking direction; and
  a busbar connection portion disposed closer to an end of the first branch strip than the bent portion and connected to the corresponding busbar,
  the second branch strip having
  a device connection portion to be connected to the external device.

[2] The busbar module according to the item [1], wherein
  at least a part of the second branch strip extends in the stacking direction and has a bent shape around the axis crossing the stacking direction.

[3] The busbar module according to the item [1] or the item [2], wherein
  the second branch strip branches off the main strip from a side edge of the main strip or from inside area of the main strip.

[4] The busbar module according to any one of the item [1] to the item [3], wherein
  the first branch strip extends from the main strip toward one side in the thickness direction of the main strip,
  the second branch strip extends from the main strip toward the other side in the thickness direction of the main strip.

[5] The busbar module according to any one of the item [1] to the item [4], wherein
  the device connection portion has a connector structure to be connected to a counterpart connector of the external device or a board connection structure to be connected to a circuit board of the external device.

According to first aspect of the invention, relating to the item [1], the circuit body which is a flexible circuit board is composed of the band-shaped main strip, the band-shaped busbar branch strips which branch off the main strip, and the device branch strip. Each of the busbar branch strips connected to the respective busbars includes the bent portion that is bent along the axis that crosses the stacking direction of the plurality of cells. With this configuration, when the battery assembly extends or contracts in its stacking direction due to thermal deformation of each cell, each busbar can move in the stacking direction of the cells because the bent portion of each busbar branch strip of the circuit body is bent or stretched. Likewise, dispersion of the size of the battery assembly in its stacking direction due to an assembling allowance of each cell can be absorbed by bending or stretching of the bent portions of the busbar branch strips of the circuit body. In other words, the busbar module having this configuration can easily accommodate expansion/contraction and manufacture dispersion of the battery assembly by deformation of substantially only the busbar branch strips with no deformation of the main strip of the circuit body.

Furthermore, the busbar module having this configuration can flexibly accommodate external devices having various structures or installed at various locations by determining, as appropriate, a position where the device branch strip to be connected to an external device (e.g., voltage detection device (not shown)) branches off the main strip according to an installation location of the external device or its structure (e.g., a position of a connector of the external device).

In general, even in the case where a flexible circuit board includes a number of circuit structures, it can be deformed flexibly by a much weaker force than the electric wires used in the above-described conventional busbar module. Thus, the ease of attachment of the circuit body to the battery assembly is increased remarkably.

As such, the busbar module having this configuration is higher in the ease of attachment to the battery assembly and the followability to deformation and manufacture dispersion of the battery assembly and is also higher in the degree of freedom of selection of an installation location and a structure of an external device than the above-described conventional busbar module.

According to second aspect of the invention, relating to the item [2], like each busbar branch strip connected to the associated busbar, the device branch strip to be connected to the external device has a shape obtained by being bent along an axis that crosses the stacking direction of the plurality of cells. Thus, the busbar module can flexibly accommodate external devices that are different from each other in installation location or structure. Furthermore, since the device branch strip is bent and stretched, work of connecting the device branch strip to the external device (e.g., work of fitting the connector provided at the end of the device branch strip to a connector of the external device) is made easier and hence work of connecting the busbar module to the external device can be increased in efficiency. Incidentally, as in the case of each busbar branch strip, even when the device branch strip is bent or stretched, substantially only the device branch strip is deformed with no deformation of the main strip of the circuit body.

According to third aspect of the invention, relating to the item [3], the device branch strip branches off the main strip from a side edge of the main strip or from inside the main strip and then extends toward the external device. This structure makes it possible to accommodate, more flexibly, external devices that are different from each other in installation location or structure. Where the device branch strip branches off the main strip from a side edge of the main strip, the device branch strip may be formed so as to, for example, either extend from the side edge in the width direction of the main strip or extend in the thickness direction of the main strip from an edge of a cut that is formed so as to have an opening in the side edge. Where the device branch strip branches off the main strip from inside the main strip, the device branch strip may be formed so as to, for example, extend in the thickness direction of the main strip from an edge of an opening formed inside the main strip.

According to fourth aspect of the invention, relating to the item [4], each of the busbar branch strips and the device branch strip extend in the thickness direction of the main strip toward the opposite sides. With this measure, the device branch strip can be prevented from interfering with the busbar branch strips by, for example, disposing the battery assembly under the busbar module and disposing the external device above the busbar module.

According to fifth aspect of the invention, relating to the item [5], the device connection portion of the device branch strip may have, for example, a connector structure that can be connected to a counterpart connector of the external device or a structure that can be connected directly to a circuit board of the external device. In this manner, the device branch strip can be connected to various kinds of external devices.

The invention can provide a busbar module that is high in the ease of attachment to a battery assembly and the followability to deformation and manufacture dispersion of the battery assembly and is also high in the degree of freedom of selection of an installation location and structure of an external device.

The invention has been described above concisely. The details of the invention will become more apparent when the modes for carrying out the invention (hereinafter referred to as an embodiment) described below are read through with reference to the accompanying drawings.

BRIEF DESCRIPTION OF THE DRAWINGS

FIG. 8A shows a case that the bent portion assumes a Z shape as a whole, FIG. 8B shows a case that the bent portion assumes a C shape as a whole, and FIG. 8C shows a case that the bent portion assumes an O shape as a whole.

DETAILED DESCRIPTION

Embodiment

A busbar module 10 according to an embodiment of the present invention will be hereinafter described with reference to the drawings. The busbar module 10 according to the embodiment is used being attached to a battery assembly (i.e., a battery module in which plural cells are laid on each other) that is a drive power source installed in an electric vehicle, a hybrid vehicle, or the like.
(Configuration of Battery Assembly 1)

Figure 2:
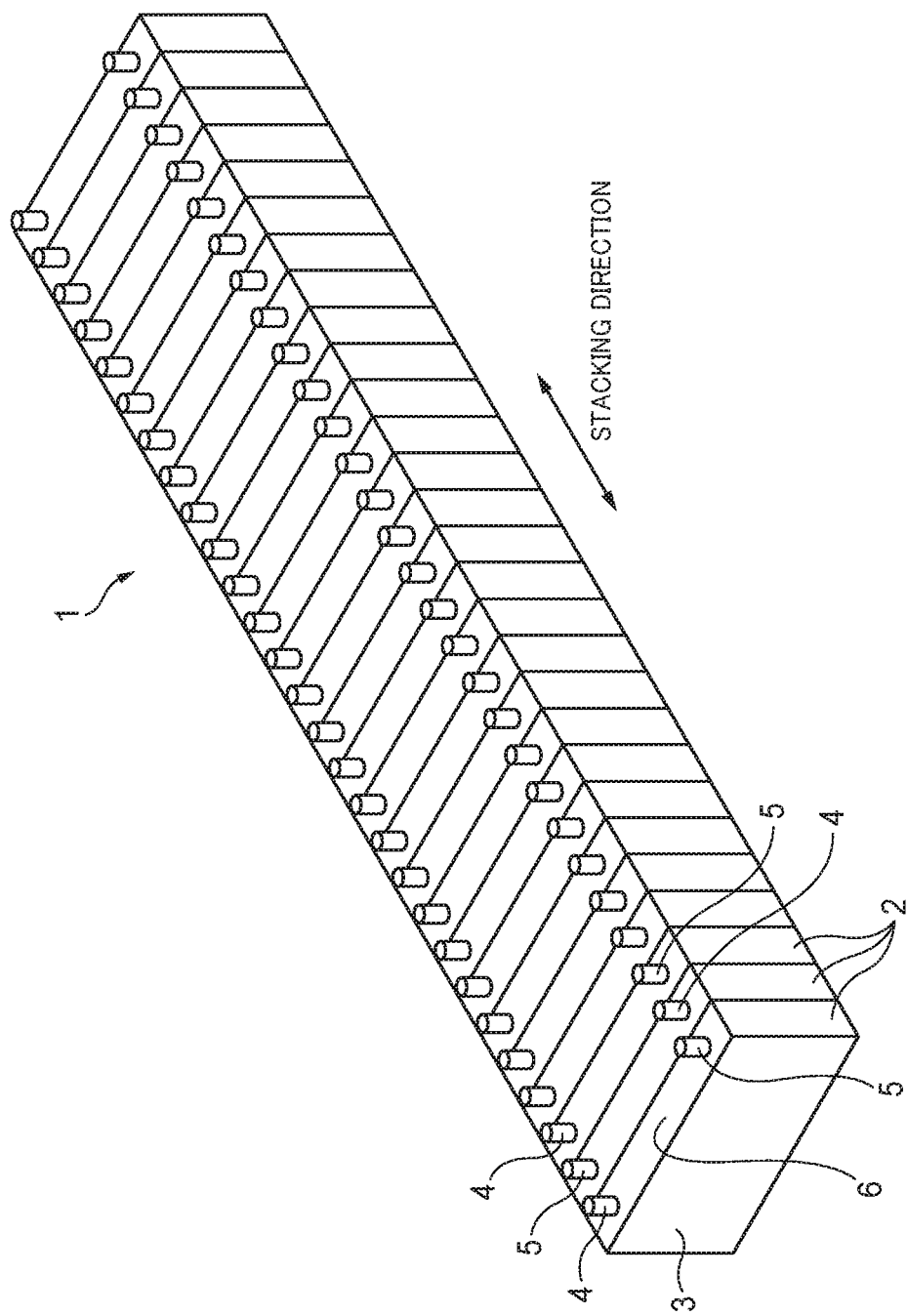
FIG. 2 is a perspective view of a battery assembly to which the busbar module according to the embodiment is to be attached.

First, a battery assembly 1 to which the busbar module 10 according to the embodiment is to be attached will be described. As shown in FIG. 2, the battery assembly 1 is configured in such a manner that plural cells 2 are connected to each other in series. A positive electrode 4 and a negative electrode 5 project from the top of a cuboid-shaped battery main body (main body) 3 of each of the plurality of cells 2. The positive electrode 4 and the negative electrode 5, which are shaped like a cylinder, are spaced from each other and project upward approximately in the vertical direction from an electrode surface 6 of the battery main body 3.

The battery assembly 1 is configured by laying the cells 2 on each other in a preset direction (stacking direction) in such a manner that the positive electrodes 4 and the negative electrodes 5 of the cells 2 are arranged alternately. The positive electrode 4 of one of end cells 2 located at the two respective ends of the series connection of the cells 2 of the battery assembly 1 serves as an assembly positive electrode and the negative electrode 5 of the other end cell 2 serves as an assembly negative electrode.
(Overall Structure of Busbar Module 10)

Figure 1:
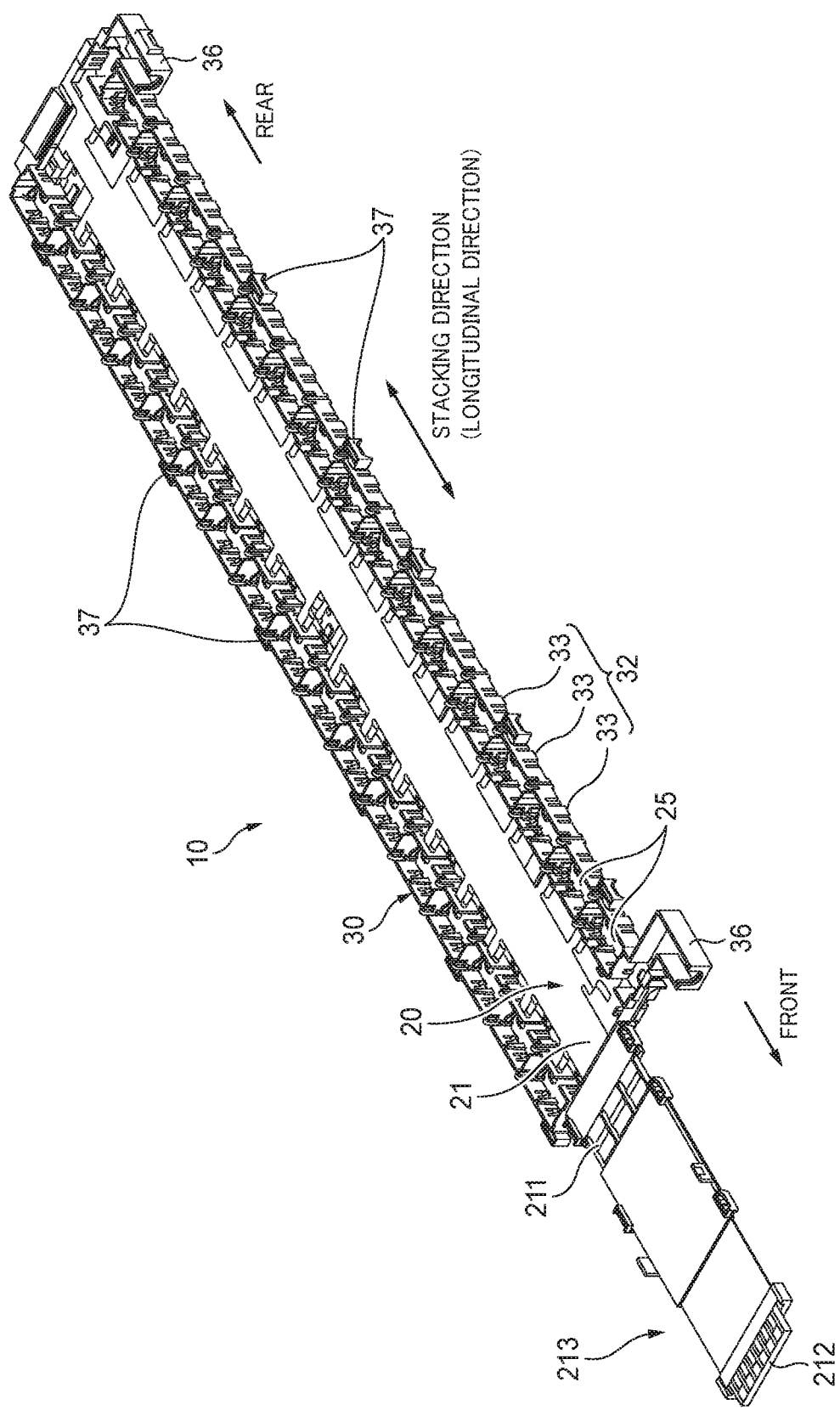
FIG. 1 is a perspective view of the whole of a busbar module according to an embodiment of the present invention.

Next, the busbar module 10 according to the embodiment will be described. As shown in FIG. 1, the busbar module 10 has a circuit body 20 which is a flexible circuit board (FPC) and to which busbars 25 (see FIG. 3) to be connected to the positive electrodes 4 and the negative electrodes 5 of the cells 2 are attached and a holder (electrode routing body) 30 which houses and holds the circuit body 20 and attaches it to the battery assembly 1.

Figure 3:
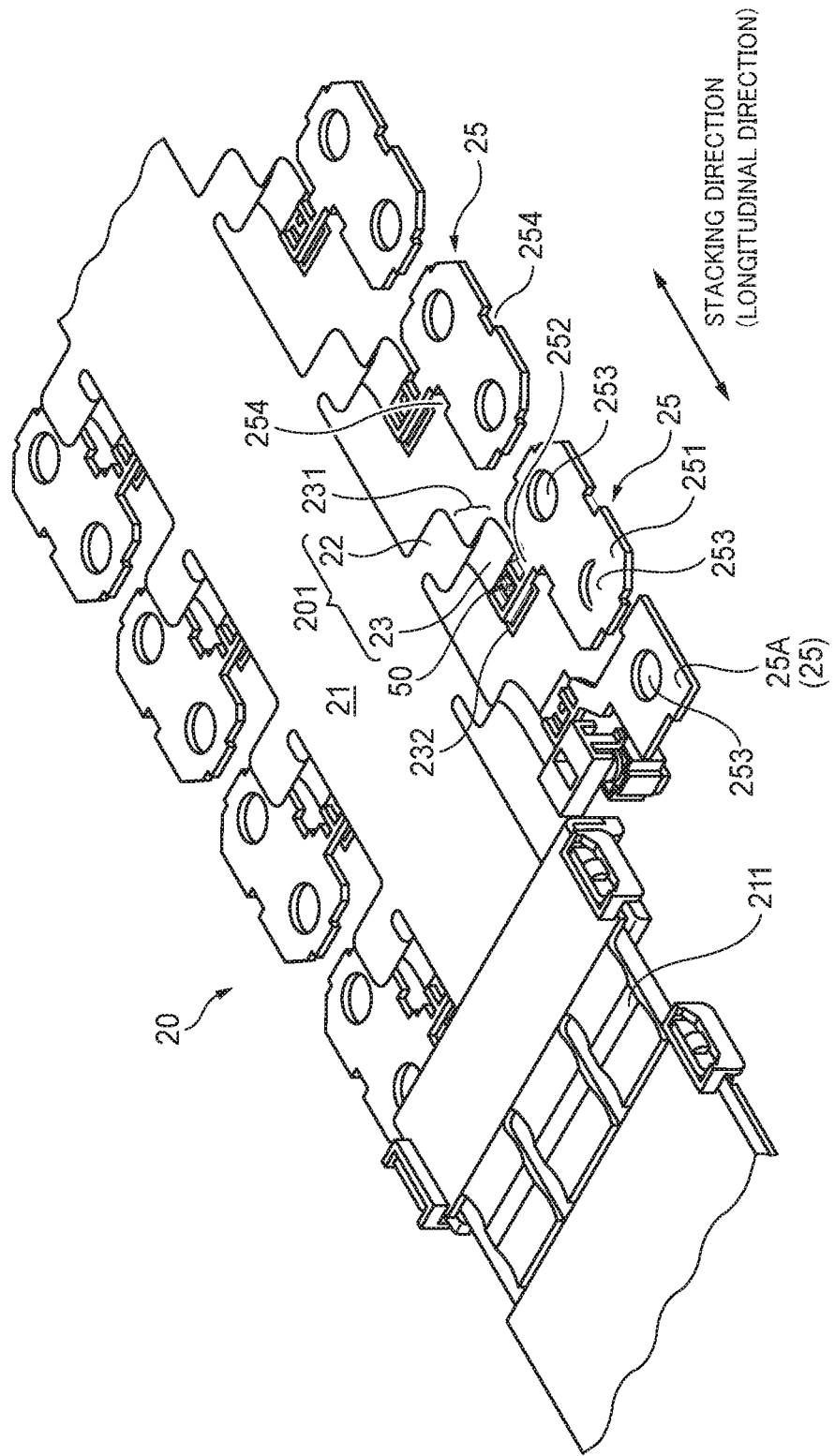
FIG. 3 is an enlarged perspective view of an end portion of a circuit body.

As shown in FIGS. 1 and 3, the circuit body 20 has a band-shaped main strip 21 which is formed with plural wiring patterns and is to extend over the cells 2 in their stacking direction. In this example, a connector 212 is attached to an end portion of the main strip 21 via voltage detection lines 211 which lead out of the main strip 21. The connector 212 can be connected to a voltage detection device (external device, not shown) that is provided outside the busbar module 10.

Busbar branch strips 201 each of which consists of a first branch portion 22 and a second branch portion 23 are connected to side edges, extending parallel with the longitudinal direction (substantially coincident with the stacking direction of the battery assembly 1) of the main strip 21, of the main strip 21. More specifically, band-shaped first branch portions 22 extending in the direction that crosses the longitudinal direction and the thickness direction of the main strip 21 (i.e., outward in the width direction of the main strip 21) are connected to the side edges of the main strip 21. Band-shaped second branch portions 23 extend from the tips of the first branch portions 22, respectively, in parallel with the stacking direction of the battery main bodies 3. The main strip 21, the first branch portions 22, and the second branch portions 23 are an FPC and hence can be deformed flexibly particularly in the direction that is perpendicular to their planes.

Figure 4:
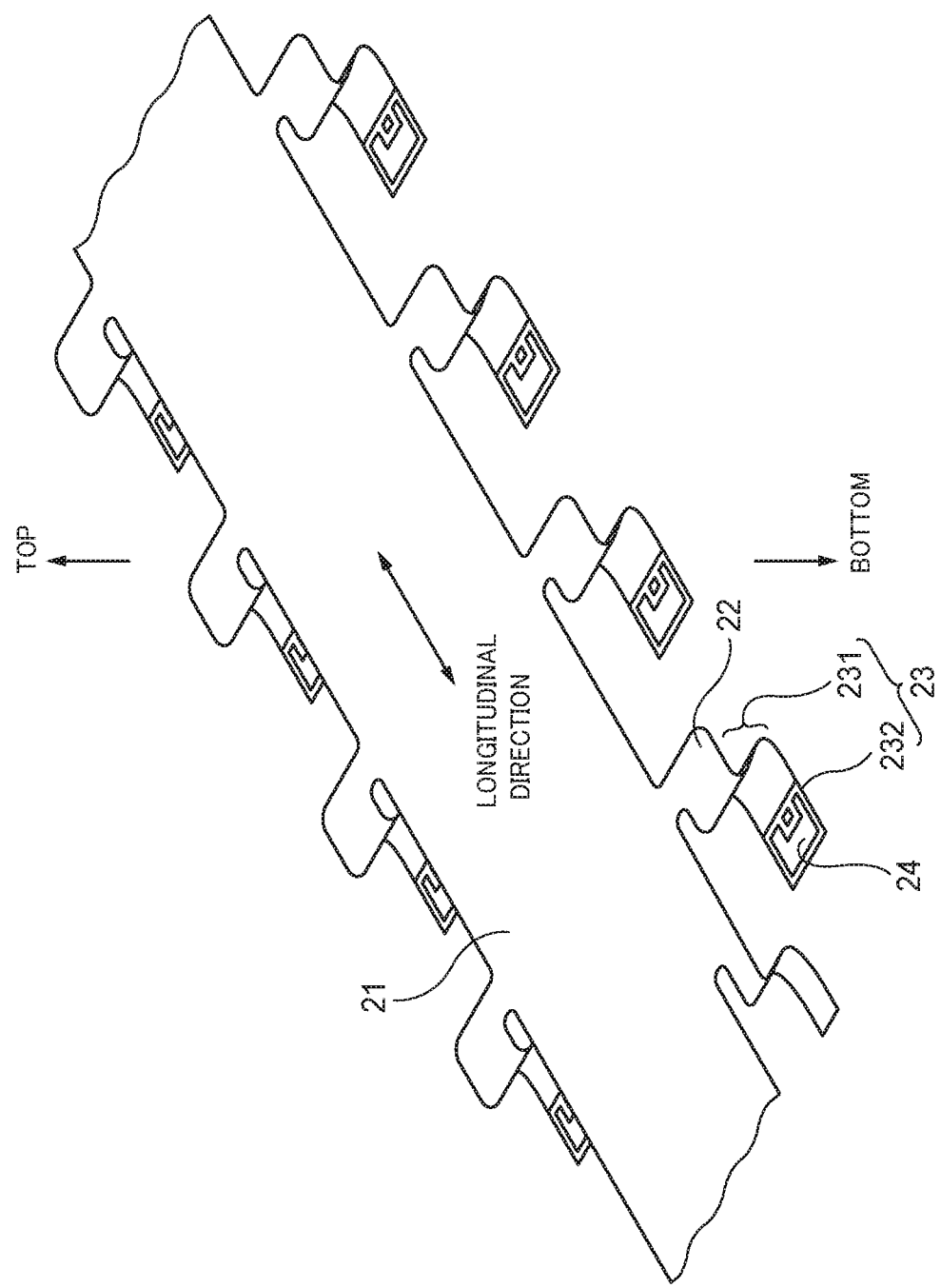
FIG. 4 is a perspective view showing how a main strip and busbar branch strips of the circuit body are formed.
Figure 5A:
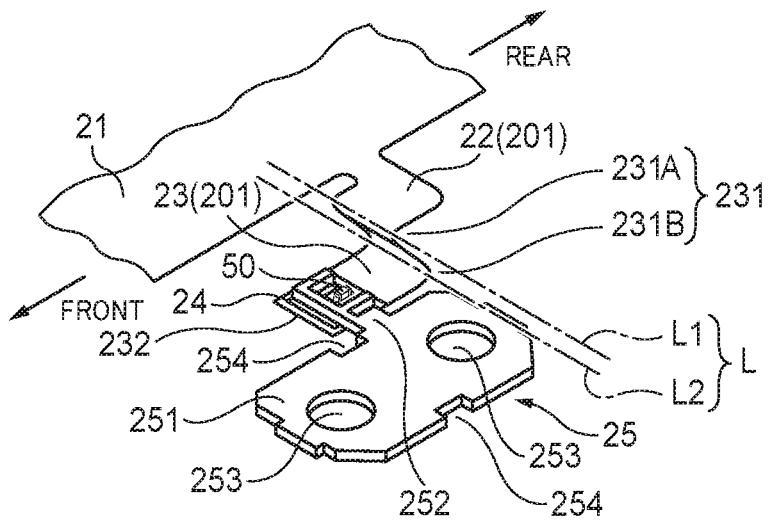
FIG. 5A is a perspective view showing a state that a second branch portion of each busbar branch strip is bent so as to assume an S shape as a whole.

As shown in FIGS. 4 and 5A, each second branch portion 23 has a bent portion 231 which is bent along lines L1 and L2 that cross the stacking direction (in this example, substantially coincident with the extension direction of the second branch portion 23) of the battery assembly 1 (that is, along axes extending parallel with the width direction of the second branch portion 23). Having a first bent portion 231A which is bent along the axis L1 and a second bent portion 231B which is bent along the axis L2, the second branch portion 23 is bent so as to assume an S shape (or an inverted S shape) as a whole. As such, the second branch portion 23 can move in the longitudinal direction of the main strip 21 (i.e., the stacking direction of the battery assembly 1) and extend and contract in the top-bottom direction.

The first branch portions 22 are located outside the main strip 21 in the same plane as the main strip 21, and the second branch portions 23 are connected to the respective first branch portions 22. Thus, the second branch portions 23 are located outside the main strip 21 in its width direction and extend generally downward so as to assume an S shape in a state that there is no deviation between the battery assembly 1 and the circuit body 20 (see FIG. 5A). Thus, the busbars 25 are located outside the main strip 21 in its width direction below the plane of the main strip 21.

An end portion, opposite to the first branch portion 22, of each second branch portion 23 is a tip portion 232 having a plane that is approximately parallel with the main strip 21, and a connection portion 24 is attached to the top surface of the tip portion 232. The bottom surface of the connection portion 24 is parallel with and at a different height as the bottom surface of the main strip 21, and hence these bottom surfaces are spaced from each other. The top surface of the connection portion 24 is connected to a busbar 25 that connects a positive electrode 4 and a negative electrode 5 of adjacent cells 2 of the battery assembly 1. Since the second branch portion 23 is thus connected to the electrodes 4 and 5 of those cells 2 via the connection portion 24 and the busbar 25, the associated voltage detection line 211 is connected to the electrodes 4 and 5.

As shown in FIGS. 3 and 5A, each busbar 25 is a plate-like conductive member (made of copper, for example) and has a busbar main body 251 which is rectangular as a whole and a connection piece 252 which projects from the busbar main body 251 to the side of the main strip 21. Two electrode holes 253 into which a positive electrode 4 and a negative electrode 5 of adjacent cells 2 are to be inserted, respectively, penetrate through the busbar main body 251. The side edge located on the side of the main strip 21 and the opposite side edge of the busbar main body 251 are formed with respective positioning recesses 254 at positions corresponding to the middle between the two electrode holes 253. The connection portion 24 of the second branch portion 23 is connected to the bottom surface of the connection piece 252 of the busbar 25.

Busbars 25A that are located at the two respective ends of the main strip 21 in its longitudinal direction are connected to the assembly positive electrode or the assembly negative electrode and are each formed with one electrode hole 253 through which the assembly positive electrode or the assembly negative electrode is to be inserted. Power cables (not shown) for extracting power from the battery assembly 1 are connected to the respective busbars 25A.

(Structure of Holder 30)

Figure 6:
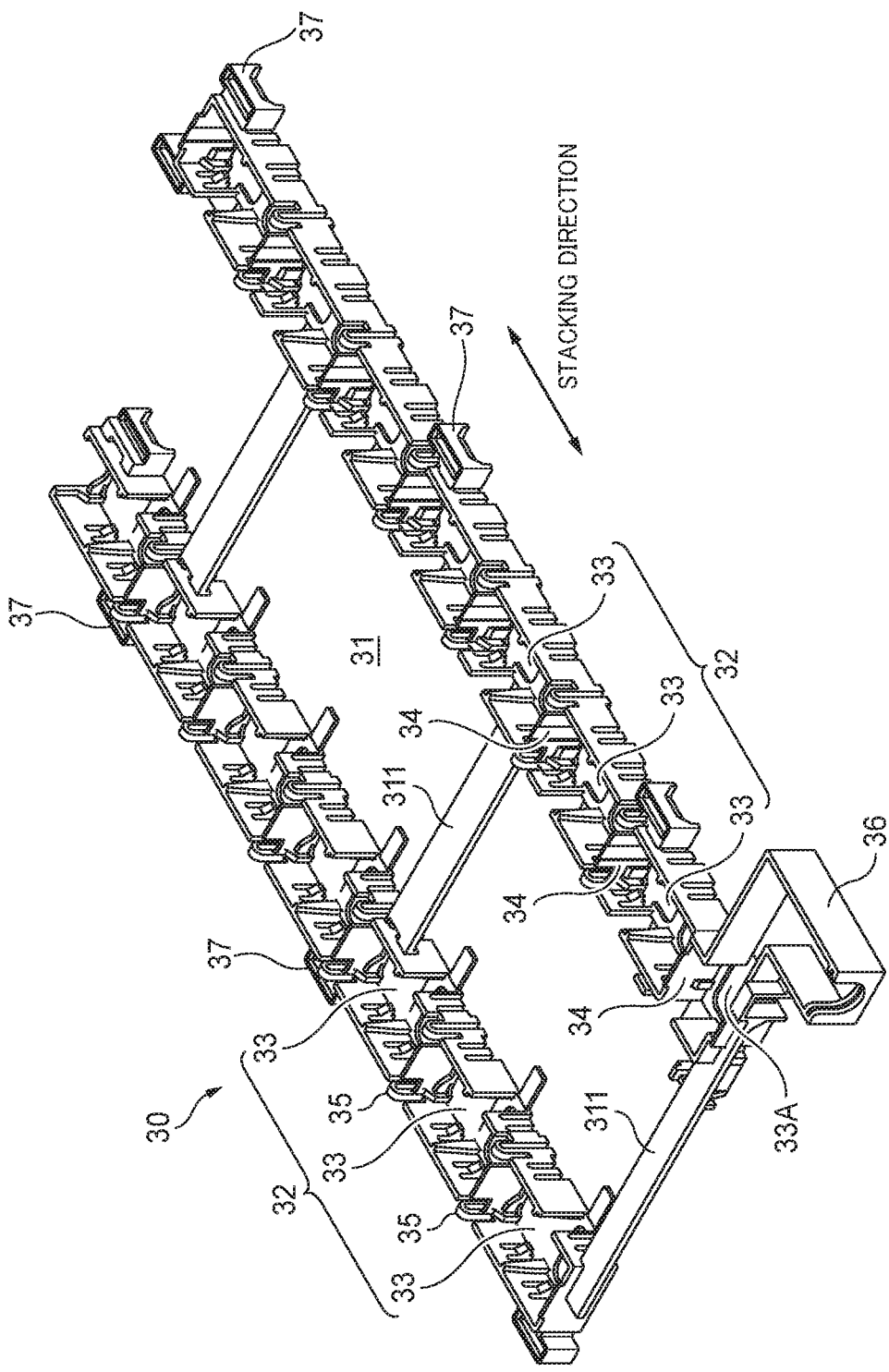
FIG. 6 is a perspective view of part of a holder.

As shown in FIG. 6, the holder 30 is made of a resin, for example, and has, at the center in the width direction, a main strip housing portion 31 which extends in the stacking direction of the cells 2 and houses and holds the main strip 21 of the circuit body 20. The main strip housing portion 31 is provided with main strip support members 311 which are arranged at preset intervals in the longitudinal direction of the main strip 21 to be housed. The main strip 21 is put on the main strip support members 311. The main strip support members 311 may be omitted if the main strip 21, the first branch portions 22, and the second branch portions 23 are strong enough to allow the circuit body 20 of this example to be self-supported even if it is not supported by the main strip support members 311. The main strip support members 311 may be provided even in such a case to exercise an auxiliary support function even in a case that the circuit body 20 cannot be self-supported for a certain reason. That is, the circuit body 20 may be either put on and supported by the main strip support members 311 or self-supported without the main strip support members 311.

Figure 7:
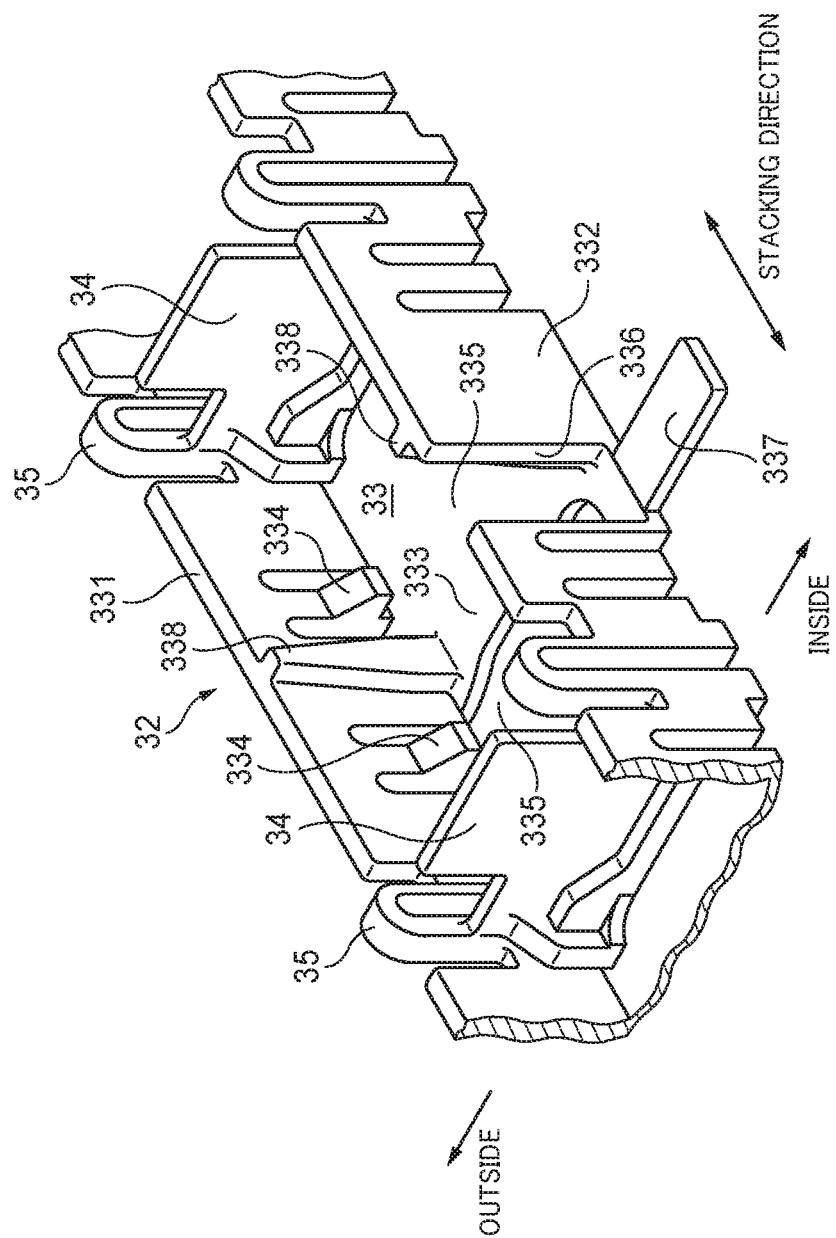
FIG. 7 is a perspective view of a housing space of a busbar housing portion.

Two busbar housing portions 32 for housing the busbars 25 are provided outside the main strip housing portion 31 in the width direction. Each busbar housing portion 32 is provided with plural housing spaces 33 which are to house respective busbars 25 and are arranged in the stacking direction of the cells 2. As also shown in FIG. 7, adjacent housing spaces 33 are bounded by a partition wall 34, whereby the busbars 25 housed there are prevented from coming into contact with each other. Housing spaces 33A for housing the busbars 25A to which the power cables (not shown) are connected, respectively, are provided adjacent to the two respective ends of the main strip 21 in its longitudinal direction, and power cable housing portions 36 are provided so as to be continuous with the respective housing spaces 33A.

As shown in FIG. 7, each housing space 33, which is a rectangular space that is open at the top, is bounded by an outer wall 331 located outside in the width direction, an inner wall 332 located inside in the width direction, and a pair of partition walls 34 located on the two respective ends in the stacking direction. The partition wall 34 located on one side in the stacking direction (the left-side partition wall 34 in FIG. 7) is connected to the outer wall 331 and the inner wall 332 via respective extendable/contractable portions 35. Thus, each housing space 33 can extend and contract in the stacking direction.

Bottom end portions of the outer wall 331 and the inner wall 332 are connected to each other by a connection plate 333. The bottom end portions of the outer wall 331 and the inner wall 332 are formed with lock nails 334 inside, whereby a busbar 25 can be held between the connection plate 333 and the lock nails 334. Projections 338 project inward from the inner side surfaces of the outer wall 331 and the inner wall 332 at the centers in the stacking direction, respectively. The projections 338 serve to position the associated busbar 25 by fitting into the respective positioning recesses 254 (see FIG. 5A) of the busbar 25.

The inner wall 332 is formed with a cut 336 and a support plate 337 projects inward at a position corresponding to the cut 336. As a result, the connection piece 255 of the busbar 25 housed in the housing space 33 is supported by the support plate 337.

The connection plate 333 is formed with spaces 335 on the two respective sides of the center in the stacking direction. Thus, the positive electrode 4 and the negative electrode 5 of the cells 2 can be exposed in the housing space 33 through the respective spaces 335 and can be connected to the electrode holes 253 of the busbar 25 housed in the housing space 33. A bottom plate may be provided in place of the connection plate 333 so as to be formed with cuts or holes corresponding to the positive electrode 4 and the negative electrode 5 of the cells 2, respectively.

As shown in FIG. 1, the holder 30 houses and holds a portion of the circuit body 20, the portion being located in the rear of a position that is located in the rear of the front end, to which the connector 212 is connected, of the main strip 21 by a preset length (i.e., the portion in a range including at least positions where the first branch portions 22 branch off the main strip 21). In other words, a portion (hereinafter referred to as an "exposed portion 213"), having the preset length from the front end, to which the connector 212 is connected, of the main strip 21 is not housed in the holder 30 and is exposed from the holder 30.

(Operation of Busbar Module 10)

Figure 5B:
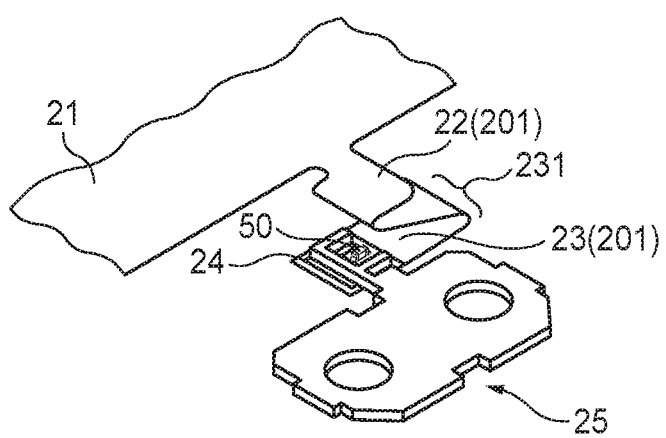
FIG. 5B is a perspective view showing how the second branch portion is deformed when a busbar is moved rearward relatively.
Figure 5C:
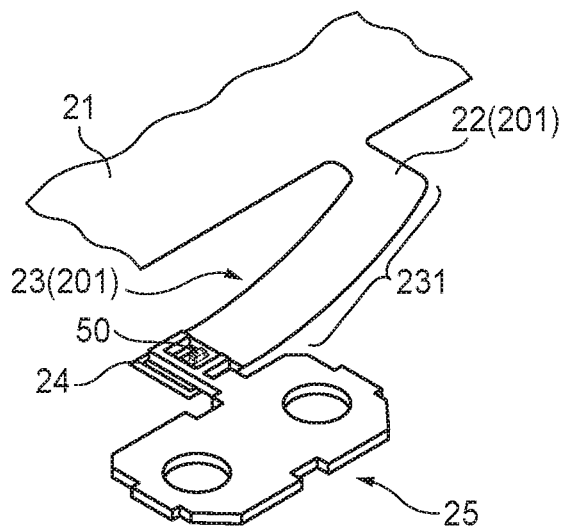
FIG. 5C is a perspective view showing a state that the second branch portion is stretched when the busbar is moved forward relatively.

Next, a description will be made of how the busbar module 10 operates. FIG. 5A shows a state that the second branch portion 23 is bent so as to assume an S shape as a whole, FIG. 5B shows a state that the second branch portion 23 is stretched rearward a little, and FIG. 5C shows a state that the second branch portion 23 is stretched forward.

As described above, the main strip 21 is put on the main strip support members 311 of the holder 30 and hence can move upward and in the longitudinal direction. Although the busbars 25 are housed in the respective housing spaces 33, the housing spaces 33 can move in the longitudinal direction of the main strip 21. The main strip 21 is connected to the busbars 25 via the respective second branch portion 23 which are bent in an S shape (see FIG. 5A).

Even if, for example, the battery assembly 1 is deformed in this state and the relative positional relationship between the battery assembly 1 and the circuit body 20 is changed and the relative positional relationships between the main strip 21 and the busbars 25 are thereby changed, the changes (deviations) in the relative positional relationships can be absorbed by bending or stretching of the second branch portions 23. Likewise, even if the size of the battery assembly 1 in its stacking direction varies from one battery assembly 1 manufactured to another due to an assembling allowance of the plurality of cells 2, that manufacture dispersion can be absorbed by bending or stretching of the second branch portions 23.

This will be described below more specifically. FIG. 5B shows a case that the busbar 25 has deviated a little rearward (rightward in FIG. 5B) with respect to the main strip 21. In this case, the S shape of the bent portion 231 of the second branch portion 23 is deformed to absorb the deviation of the busbar 25. FIG. 5C shows a case that the busbar 25 has deviated greatly forward (leftward in FIG. 5C) with respect to the main strip 21. In this case, the S shape of the bent portion 231 of the second branch portion 23 is stretched to absorb the deviation of the busbar 25. Although not shown in any drawings, when the main strip 21 is moved upward or downward and its relative positional relationships with the busbars 25 are thereby changed, the S shape of each bent portion 231 is stretched in the top-bottom direction to absorb that changes in the relative positional relationships.

Figure 8A:
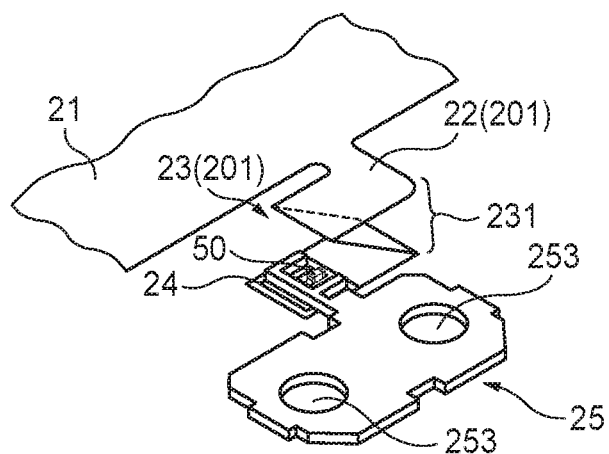
FIGS. 8A-8C are perspective views showing modifications of a bent portion of the second branch portion of each busbar branch strip that is part of the circuit body.
Figure 8B:
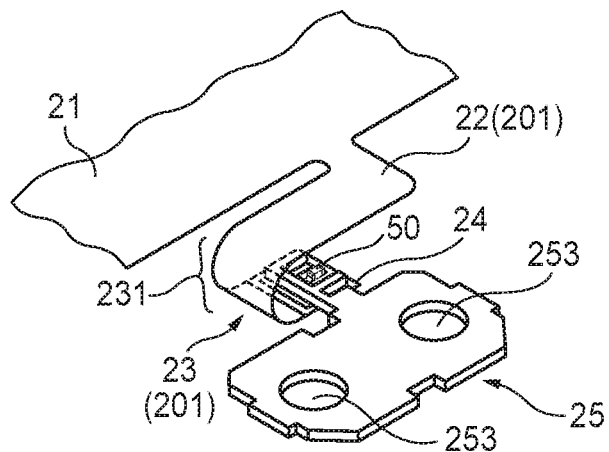
Figure 8C:
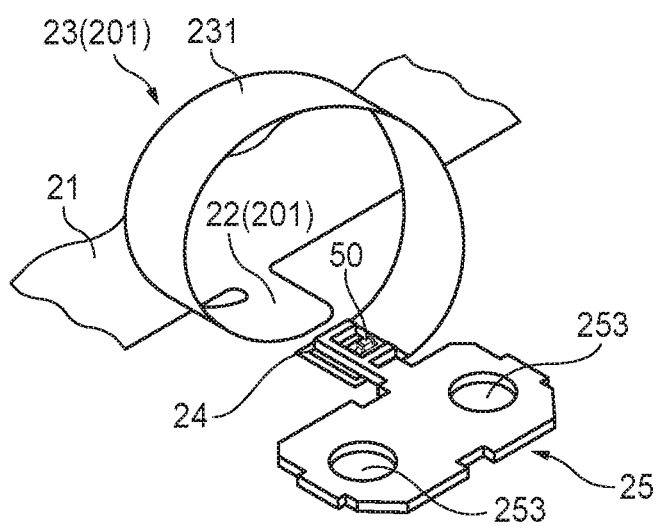

In the above-described embodiment, the bent portion 231 of each second branch portion 23 is bent so as to assume an S shape (or inverted S shape) as a whole. Alternatively, as shown in FIG. 8A, each bent portion 231 may be bent so as to assume a Z shape (or an inverted Z shape) as a whole. As another alternative, as shown in FIG. 8B, each bent portion 231 may be bent so as to assume a C shape (or an inverted C shape) as a whole. As a further alternative, as shown in FIG. 8C, each bent portion 231 may be formed so as to assume an O shape. As in the example shown in FIG. 8C, if necessary, the branch portions 22 and 23 may be formed so that the bottom surfaces of the main strip 21 and each connection portion 24 are in the same plane.

Figure 9A:
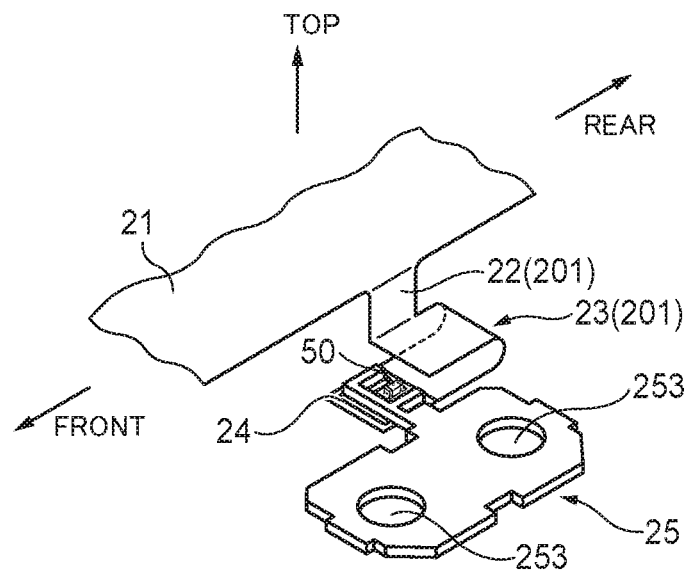
FIG. 9A is a perspective view showing a modification of a first branch portion of each busbar branch strip and FIG. 9B is a perspective view showing a modification of the portion where each busbar branch strip branches off the main strip.
Figure 9B:
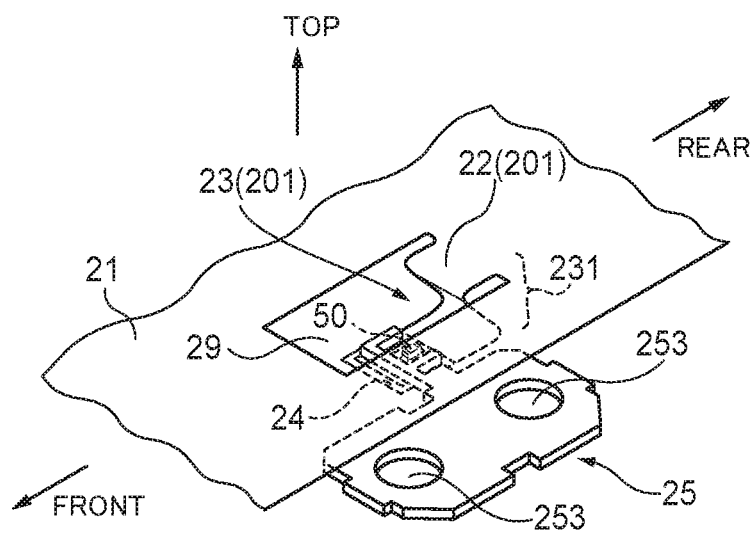

Although in the above embodiment each first branch portion 22 is in the same plane as the main strip 21, as shown in FIG. 9A each first branch portion 22 may extend in such a direction as to cross the bottom surface of the main strip 21 (e.g., in FIG. 9A the first branch portion 22 extends perpendicularly to the main strip 21, more specifically, downward). Although in the above-described embodiment each first branch portion 22 branches off the main strip 21 from its side edge, another alternative is possible in which as shown in FIG. 9B openings 29 are formed inside the main strip 21 and each first branch portion 22 branches off the main strip 21 from an edge of the associated opening 29.

(Modifications of Connection Between Circuit Body 20 and External Device)

In the embodiment, as described above with reference to FIG. 1, the connector 212 is connected to the voltage detection lines 211 that are led out so as to be connected to the end portion of the main strip 21. The circuit body 20 is connected to the voltage detection device using the connector 212.

In the following, modifications of the connection between the circuit body 20 and the voltage detection device (external device) will be described with reference to FIG. 10 and FIGS. 11A and 11B.

Figure 10:
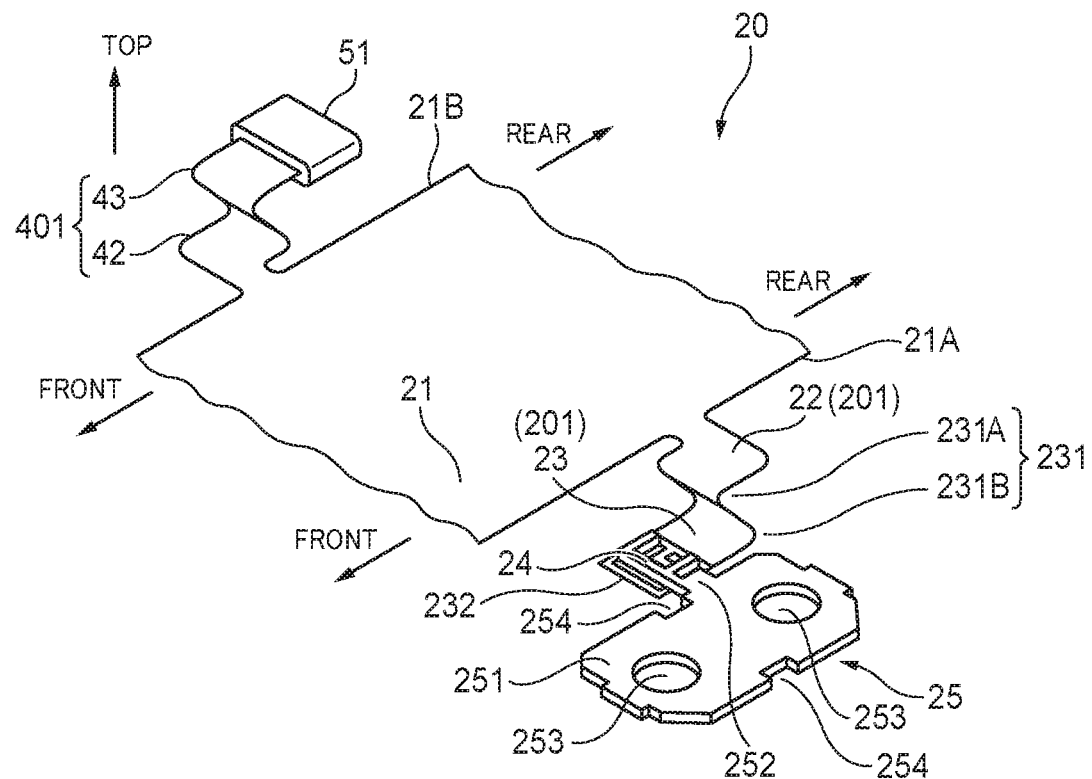
FIG. 10 is a perspective view of part of a circuit body having both of busbar branch strips and a device branch strip and shows a modification of the connection between the circuit body and a voltage detection device (external device).
Figure 11A:
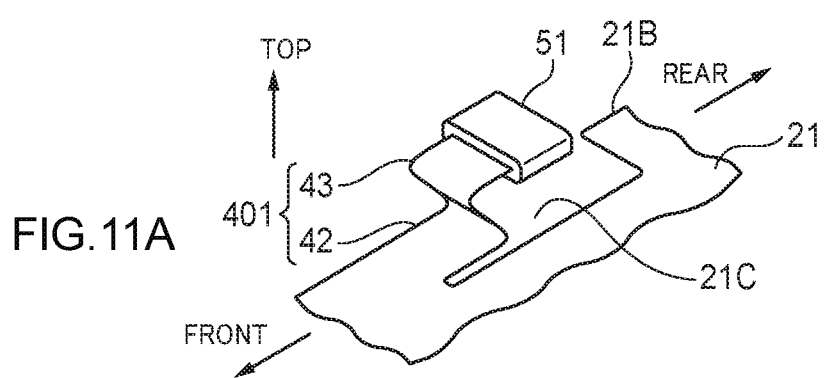
FIG. 11A is a perspective view showing a modification of the device branch strip shown in FIG. 10
Figure 11B:
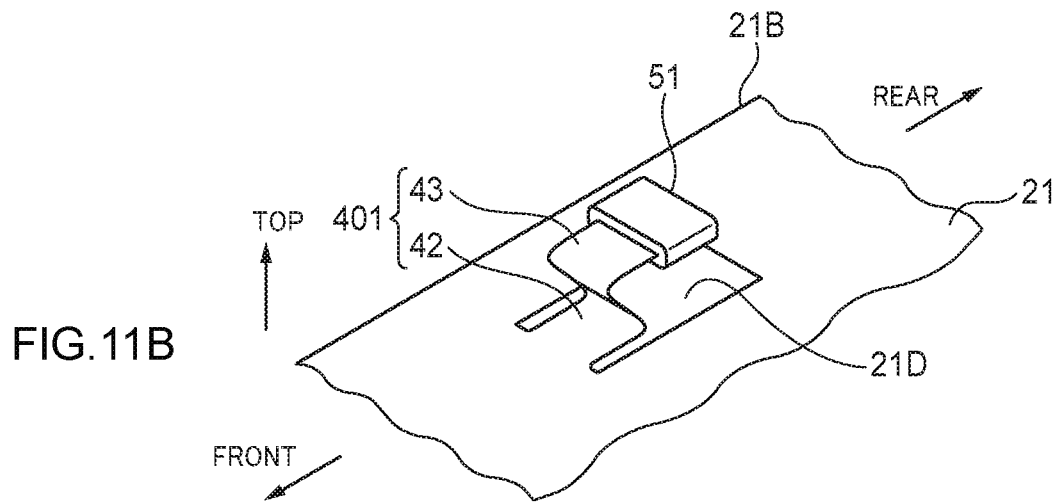
FIG. 11B is a perspective view showing another modification of the device branch strip.

As shown in FIG. 10, in one modification, each busbar branch strip 201 (first branch portion 22 and second branch portion 23) branches off the main strip 21 from its one side edge 21A and extends downward and a device branch strip 401 branches off the main strip 21 from its other side edge 21B and extends upward. Like each busbar branch strip 201 described above, the device branch strip 401 has a band-shaped first branch portion 42 which extends in a direction that crosses the longitudinal direction and the thickness direction of the main strip 21 (i.e., outward in the width direction of the main strip 21). A band-shaped second branch portion 43 extends from the tip of the first branch portion 42 in a direction that is parallel with the stacking direction of the battery main bodies 3. A terminal portion of the second branch portion 43 is provided with a connector 51. The connector 51 is connected to a connector (not shown) of a voltage detection device (not shown) that is installed above the busbar module 10.

The main strip 21, the first branch portion 42, and the second branch portion 43 are an FPC. Thus, as in the case shown in FIGS. 5A-5C, the main strip 21 and the device branch strip 401 can be deformed flexibly particularly in the direction that is perpendicular to their planes.

More specifically, like the second branch portion 23 of each busbar branch strip 201, the second branch portion 43 of the device branch strip 401 is bent in an S shape (or an inverted S shape) as a whole. Thus, the second branch portion 43 can move in the longitudinal direction of the main strip 21 (i.e., the stacking direction of the battery assembly 1) and extend and contract in the top-bottom direction. Furthermore, the first branch portion 42 of the device branch strip 401 is disposed outside the main strip 21 in the same plane and the second branch portion 43 is connected to the first branch portion 42. Thus, the second branch portion 43 is located outside the main strip 21 in its width direction and assumes an S shape (erected upward) in a state that the relative positional relationship between the voltage detection device and the circuit body 20 is not varied.

(Modifications of Device Branch Strip 401)

In the example shown in FIG. 10, the device branch strip 401 extends from the side edge 21B of the main strip 21. Alternatively, as shown in FIG. 11A, a device branch strip 401 may be configured so as to extend in the thickness direction of the main strip 21 from an edge of a cut 21C that is formed so as to have an opening in the side edge 21B. As another alternative, as shown in FIG. 11B, a device branch strip 401 may be configured so as to extend in the thickness direction of the main strip 21 from an edge of an opening 21D that is formed inside the main strip 21 at a position distant from the side edge 21B.

The position of the device branch strip 401 may be determined as appropriate taking the positional relationship between the busbar module 10 and the voltage detection device and other factors into consideration.

Main Advantages of Embodiment

As described above, in the busbar module 10 according to the embodiment, the circuit body 20 which is a flexible circuit board (FPC) is composed of the band-shaped main strip 21, the band-shaped busbar branch strips 201 which branch off the main strip 21, and the device branch strip 401. Each of the busbar branch strips 201 connected to the respective busbars 25 includes the bent portion 231 which is bent along axes that cross the stacking direction of the plurality of cells 2. With this configuration, when the battery assembly 1 extends or contracts in its stacking direction due to thermal deformation of each cell 2, each busbar 25 can move in the stacking direction of the cells 2 because the bent portion 231 of each busbar branch strip 201 of the circuit body 20 is bent or stretched. Likewise, dispersion of the size of the battery assembly 1 in its stacking direction due to an assembling allowance of each cell 2 can be absorbed by bending or stretching of the bent portions 231 of the busbar branch strips 201 of the circuit body 20. In other words, the busbar module 10 having this configuration can easily accommodate expansion/contraction and manufacture dispersion of the battery assembly 1 by deformation of substantially only the busbar branch strips 201 with no deformation of the main strip 21 of the circuit body 20.

Furthermore, the busbar module 10 having this configuration can flexibly accommodate external devices having various structures or installed at various locations by determining, as appropriate, a position where the device branch strip 401 to be connected to an external device (e.g., voltage detection device (not shown)) branches off the main strip 21 according to an installation location of the external device or its structure (e.g., a position of a connector of the external device).

In general, even in the case where a flexible circuit board includes a number of circuit structures, it can be deformed flexibly by a much weaker force than the electric wires used in the above-described conventional busbar module. Thus, the ease of attachment of the circuit body 20 to the battery assembly 1 is increased remarkably.

As such, the busbar module 10 having this configuration is higher in the ease of attachment to the battery assembly 1 and the followability to deformation and manufacture dispersion of the battery assembly 1 and is also higher in the degree of freedom of selection of an installation location and a structure of an external device than the above-described conventional busbar module.

Like each busbar branch strip 201 connected to the associated busbar 25, the device branch strip 401 to be connected to the external device has a shape obtained by being bent along an axis that crosses the stacking direction of the plurality of cells 2. Thus, the busbar module 10 can flexibly accommodate external devices that are different from each other in installation location or structure. Furthermore, since the device branch strip 401 is bent and stretched, work of connecting the device branch strip 401 to the external device (e.g., work of fitting the connector 51 provided at the end of the device branch strip 401 to a connector of the external device) is made easier and hence work of connecting the busbar module 10 to the external device can be increased in efficiency. Incidentally, as in the case of each busbar branch strip 201, even when the device branch strip 401 is bent or stretched, substantially only the device branch strip 401 is deformed with no deformation of the main strip 21 of the circuit body 20.

The device branch strip 401 branches off the main strip 21 from a side edge of the main strip 21 or from inside the main strip 21 and then extends toward the external device. This structure makes it possible to accommodate, more flexibly, external devices that are different from each other in installation location or structure. Where the device branch strip 401 branches off the main strip 21 from a side edge of the main strip 21, the device branch strip 401 may be formed so as to, for example, either extend from the side edge in the width direction of the main strip 21 or extend in the thickness direction of the main strip 21 from an edge of a cut that is formed so as to have an opening in the side edge. Where the device branch strip 401 branches off the main strip 21 from inside the main strip 21, the device branch strip 401 may be formed so as to, for example, extend in the thickness direction of the main strip 21 from an edge of an opening formed inside the main strip 21.

Each of the busbar branch strips 201 and the device branch strip 401 extend in the thickness direction of the main strip 21 toward the opposite sides. With this measure, the device branch strip 401 can be prevented from interfering with the busbar branch strips 201 by, for example, disposing the battery assembly 1 under the busbar module 10 and disposing the external device above the busbar module 10.

Furthermore, the device branch strip 401 has the connector 51 as a device connection portion that can be connected to a counterpart connector of the external device. The device branch strip 401 may have, for example, a structure that can be connected directly to a circuit board of the external device, instead of the connector 51. In this manner, the device branch strip 401 can be connected to various kinds of external devices.

Other Embodiments

The invention is not limited to the above embodiment and various modifications, improvements, etc. can be made as appropriate within the scope of the invention. The materials, shapes, sets of dimensions, numbers, locations, etc. of the respective constituent elements of the above embodiment are not limited to those disclosed but can be determined in desired manners as long as the invention can be implemented.

Features of the above-described busbar module 10 according to the embodiment of the invention will be summarized below concisely in the form of items [1] to [5]:

[1] A busbar module (10) to be attached to a battery assembly (1) having a stack of a plurality of cells (2) and to connect the plurality of the cells (2) to an external device, the busbar module (10) comprising:

a circuit body (20) having a flexible circuit board including a wiring pattern; a plurality of busbars (25) to be connected to corresponding electrodes of the plurality of the cells (2); and a holder (30) holding the busbars (25) and being extendable in a stacking direction of the plurality of the cells (2), the circuit body (20) having:

a band-shaped main strip (21) to be located to extend in the stacking direction;

a band-shaped first branch strip (201) branched from the main strip (21) and extending toward a corresponding busbar among the plurality of the busbars (25); and a second branch strip (401) branched from the main strip (21) and extending toward the external device, the first branch strip (201) having:

a bent portion (231) extending in the stacking direction and having a bent shape around an axis crossing the stacking direction; and a busbar connection portion (24) disposed closer to an end of the first branch strip (201) than the bent portion (231) and connected to the corresponding busbar, the second branch strip (401) having a device connection portion (51) to be connected to the external device.

[2] The busbar module (10) according to the item [1], wherein at least a part of the second branch strip (401) extends in the stacking direction and has a bent shape around the axis crossing the stacking direction.

[3] The busbar module (10) according to the item [1] or the item [2], wherein the second branch strip (401) branches off the main strip (21) from a side edge of the main strip (21) or from inside area of the main strip (21).

[4] The busbar module (10) according to any one of the item [1] to the item [3], wherein the first branch strip (201) extends from the main strip (21) toward one side in the thickness direction of the main strip (21), the second branch strip (401) extends from the main strip (21) toward the other side in the thickness direction of the main strip (21).

[5] The busbar module (10) according to any one of the item [1] to the item [4], wherein the device connection portion (51) has a connector structure to be connected to a counterpart connector of the external device or a board connection structure to be connected to a circuit board of the external device.

REFERENCE SIGNS LIST

1: Battery assembly
2: Cell
3: Battery main body (main body)
4: Positive electrode
5: Negative electrode 10: Busbar module
20: Circuit body
21: Main strip
22: First branch portion (first branch strip)
23: Second branch portion (first branch strip)
201: Busbar branch strip
231: Bent portion
231A: First bent portion
231B: Second bent portion
24: Connection portion (busbar connection portion)
25: Busbar
30: Holder
42: First branch portion (second branch strip)
43: Second branch portion (second branch strip)
401: Device branch strip
51: Connector (device connection portion)
L: Axis

The invention claimed is:

1. A busbar module to be attached to a battery assembly having a stack of a plurality of cells and to connect the plurality of cells to an external device, the busbar module comprising:
   a circuit body having a flexible circuit board including a wiring pattern;
   a plurality of busbars to be connected to corresponding electrodes of the plurality of cells; and
   a holder holding the busbars and being extendable in a stacking direction of the plurality of cells,
   the circuit body comprising:
      a band-shaped main strip to be located to extend in the stacking direction;
      a band-shaped first branch strip branched from the main strip and extending toward a corresponding busbar among the plurality of the busbars; and
      a second branch strip branched from the main strip and extending toward the external device,
   the first branch strip comprising:
      a bent portion extending in the stacking direction and having a bent shape around an axis intersecting the stacking direction; and
      a busbar connection portion disposed closer to an end of the first branch strip than the bent portion and connected to the corresponding busbar,
   wherein the bent portion includes portions at a different height than the main strip and the busbar connection portion,
   the second branch strip comprising:
      a device connection portion to be connected to the external device.

2. The busbar module according to claim 1, wherein at least a part of the second branch strip extends in the stacking direction and has a bent shape around the axis intersecting the stacking direction.

3. The busbar module according to claim 1, wherein the second branch strip branches off the main strip from a side edge of the main strip or from inside area of the main strip.

4. The busbar module according to claim 1, wherein the first branch strip extends from the main strip toward one side in a thickness direction of the main strip, the second branch strip extends from the main strip toward the other side in the thickness direction of the main strip.

5. The busbar module according to claim 1, wherein the device connection portion has a connector structure to be connected to a counterpart connector of the external device or a board connection structure to be connected to a circuit board of the external device.

6. A busbar module to be attached to a battery assembly having a stack of a plurality of cells and to connect the plurality of cells to an external device, the busbar module comprising:
   a circuit body having a flexible circuit board including a wiring pattern;
   a plurality of busbars to be connected to corresponding electrodes of the plurality of cells; and
   a holder holding the busbars and being extendable in a stacking direction of the plurality of cells,
   the circuit body comprising:
      a band-shaped main strip to be located to extend in the stacking direction;
      a band-shaped first branch strip branched from the main strip and extending toward a corresponding busbar among the plurality of the busbars; and
      a second branch strip branched from the main strip and extending toward the external device,
   the first branch strip comprising:
      a bent portion extending in the stacking direction and having a bent shape around an axis intersecting the stacking direction; and
      a busbar connection portion disposed closer to an end of the first branch strip than the bent portion and connected to the corresponding busbar,
   the second branch strip comprising:
      a device connection portion to be connected to the external device,
   wherein at least a part of the second branch strip has a bent shape around the axis intersecting the stacking direction, and
   wherein the second branch strip branches off the main strip from inside area of the main strip.

* * * * *